United States Patent
Chang et al.

(10) Patent No.: US 10,658,178 B2
(45) Date of Patent: May 19, 2020

(54) PATTERNING METHOD UTILIZING DUMMY MANDREL

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Ying-Chih Lin, Tainan (TW); Gang-Yi Lin, Taitung County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/024,907

(22) Filed: Jul. 1, 2018

(65) Prior Publication Data

US 2019/0385847 A1    Dec. 19, 2019

(30) Foreign Application Priority Data

Jun. 13, 2018 (CN) .......................... 2018 1 0605875

(51) Int. Cl.
*H01L 21/311* (2006.01)
*H01L 21/033* (2006.01)
*H01L 21/027* (2006.01)
*H01L 27/108* (2006.01)

(52) U.S. Cl.
CPC ...... *H01L 21/0337* (2013.01); *H01L 21/0276* (2013.01); *H01L 21/0332* (2013.01); *H01L 21/31111* (2013.01); *H01L 27/1085* (2013.01)

(58) Field of Classification Search
CPC ........... H01L 21/0337; H01L 21/31111; H01L 21/0332; H01L 21/0276; H01L 27/1085
See application file for complete search history.

(56) References Cited

U.S. PATENT DOCUMENTS

| | | | |
|---|---|---|---|
| 8,247,291 B2 | 8/2012 | Min | |
| 8,969,215 B2 | 3/2015 | Sim | |
| 10,153,165 B1 | 12/2018 | Chang | |
| 2004/0056332 A1* | 3/2004 | Bachrach | G02F 1/136277 257/640 |
| 2011/0014791 A1* | 1/2011 | Johnson | H01L 21/823431 438/696 |
| 2015/0111362 A1* | 4/2015 | Shieh | H01L 21/823431 438/424 |
| 2016/0254153 A1* | 9/2016 | Park | H01L 21/0338 438/695 |
| 2016/0268142 A1* | 9/2016 | Liou | H01L 21/3086 |
| 2017/0194146 A1* | 7/2017 | Hsieh | H01L 21/0337 |
| 2018/0197730 A1* | 7/2018 | Sridhar | H01L 21/02126 |

(Continued)

*Primary Examiner* — Ismail A Muse
(74) *Attorney, Agent, or Firm* — Winston Hsu

(57) ABSTRACT

A method of forming a capacitor mask includes the following steps. A bulk mandrel and a plurality of strip mandrels are formed on a mask layer. Spacers are formed on sidewalls of the bulk mandrel and the strip mandrels. The strip mandrels are removed while the bulk mandrel is reserved. A material fills in space between the spacers and on the bulk mandrel, wherein the material has a flat top surface. A patterned photoresist is formed to cover the bulk mandrel and a part of the spacers but exposing the other part of the spacers after filling the material.

15 Claims, 5 Drawing Sheets

(56) References Cited

U.S. PATENT DOCUMENTS

| | | | |
|---|---|---|---|
| 2018/0315595 A1* | 11/2018 | Lian | H01L 21/0332 |
| 2018/0323108 A1* | 11/2018 | Chen | H01L 21/823431 |
| 2018/0358459 A1* | 12/2018 | Anderson | H01L 29/785 |
| 2019/0006174 A1* | 1/2019 | Huang | H01L 21/0337 |
| 2019/0067010 A1* | 2/2019 | Shu | H01L 21/0338 |
| 2019/0378717 A1* | 12/2019 | Sung | H01L 21/0338 |

* cited by examiner

PATTERNING METHOD UTILIZING DUMMY MANDREL

BACKGROUND OF THE INVENTION

1. Field of the Invention

The present invention relates generally to a method of forming a capacitor mask, and more specifically to a method of forming a capacitor mask of a dynamic random access memory (DRAM) utilizing dummy mandrels.

2. Description of the Prior Art

Random access memory (RAM) can be operated to read data from it and write data into it. As computers containing RAM turn off, data disappears from the RAM immediately. Since data in RAM can be altered easily, RAM is widely used as temporary data storage memory in personal computers. RAM can be classified into dynamic-type and static-type.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and low cost. Thus, it is often used as a memory providing high capacity but low speed such as a main memory of a personal computer.

SUMMARY OF THE INVENTION

The present invention provides a method of forming a capacitor mask, which forms dummy mandrels on a mask layer to prevent the mask layer from being damaged while patterning the mask layer to form the capacitor mask.

The present invention provides a method of forming a capacitor mask including the following steps. A bulk mandrel and a plurality of strip mandrels are formed on a mask layer. Spacers are formed on sidewalls of the bulk mandrel and the strip mandrels. The strip mandrels are removed while the bulk mandrel is reserved. A material fills between the spacers and on the bulk mandrel, wherein the material has a flat top surface. A patterned photoresist is formed to cover the bulk mandrel and a part of the spacers but exposing the other part of the spacers after filling the material.

According to the above, the present invention provides a method of forming a capacitor mask, which forms a bulk mandrel and a plurality of strip mandrels on a mask layer, forms spacers on sidewalls of the bulk mandrel and the strip mandrels, removes the strip mandrels while reserving the bulk mandrel. In this way, the damage of the mask layer below the bulk mandrel can be avoided without extra process while the exposed mask layer is etched to form the capacitor mask.

Moreover, after the strip mandrels are removed while the bulk mandrel is reserved, a material fills in space between the spacers and on the bulk mandrel. Then, a patterned photoresist is formed to cover a part of the material, thereby avoiding the residues of the patterned photoresist between the spacers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
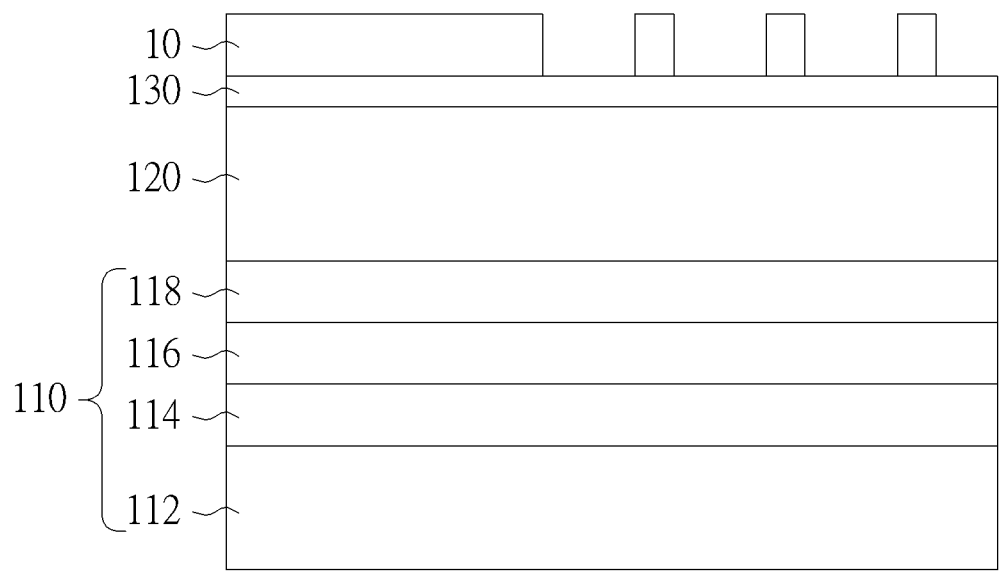
FIG. 1 schematically depicts a cross-sectional view of a method of forming a capacitor mask according to an embodiment of the present invention.

The method of forming a mask of the present invention is used for forming a capacitor mask of a dynamic random access memory (DRAM) in this embodiment, but the present invention can also be applied to pattern other material layers of the dynamic random access memory or material layers of other devices, wherein FIGS. 1-9 schematically depict cross-sectional views of a method of forming a capacitor mask according to an embodiment of the present invention. As shown in FIG. 1, a mask layer 110 is provided. In this embodiment, the mask layer 110 may include a polyslicon layer 112, a silicon nitride layer 114, an organic dielectric layer (ODL) 116 and a dielectric anti-reflection coating (DARC) layer 118 stacked from bottom to top, but it is not limited thereto. The mask layer 110 may be located on a substrate (not shown). The substrate (not shown) may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. A mandrel layer 120 and a cap layer 130 are deposited sequentially on the mask layer 110. The mandrel layer 120 may be an organic dielectric layer (ODL), and the cap layer 130 may be a dielectric anti-reflection coating (DARC) layer, but it is not limited thereto. The mandrel layer 120 may be a single layer or a multilayer, and the cap layer 130 may be a single layer or a multilayer as well. In this embodiment, the mandrel layer 120 and the cap layer 130 are both single layers. A patterned photoresist 10 is formed on the cap layer 130 to pattern the mandrel layer 120 and the cap layer 130.

Figure 2:
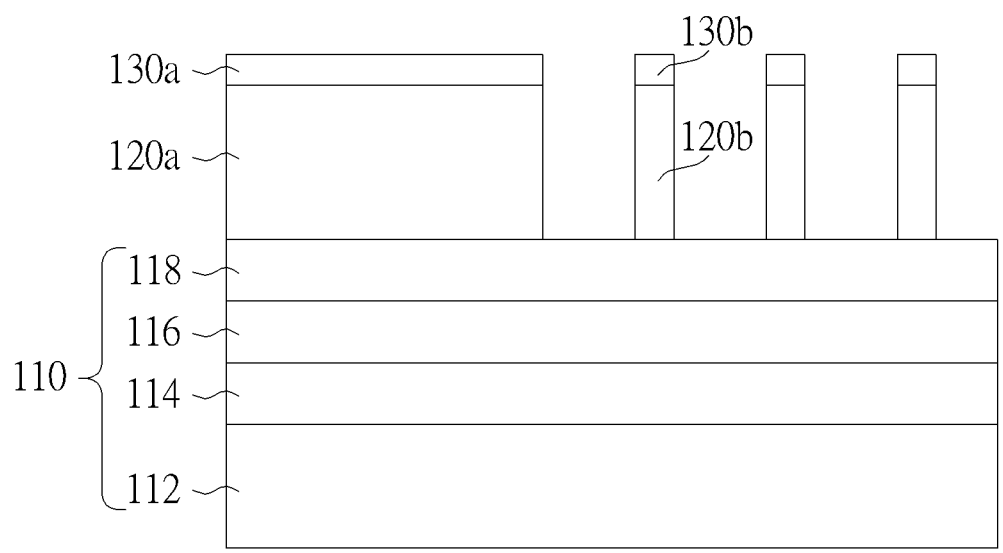
FIG. 2 schematically depicts a cross-sectional view of a method of forming a capacitor mask according to an embodiment of the present invention.

As shown in FIG. 2, a bulk mandrel 120a and a plurality of strip mandrels 120b are formed on the mask layer 110. In this embodiment, the bulk mandrel 120a and the strip mandrels 120b may constitute a patterned organic dielectric layer (ODL). In this case, the pattern of the strip mandrels 120*b* is used to transfer downward to form a capacitor mask of a dynamic random access memory (DRAM), and the bulk mandrel 120*a* is corresponding to a periphery area of the dynamic random access memory (DRAM), but it is not limited thereto. More precisely, the pattern of the patterned photoresist 10 is transferred to the mandrel layer 120 and the cap layer 130, thereby forming a cap 130*a* being located on the bulk mandrel 120*a* and a plurality of caps 130*b* being located on the strip mandrels 120*b*. The patterned photoresist 10 is then removed.

Figure 3:
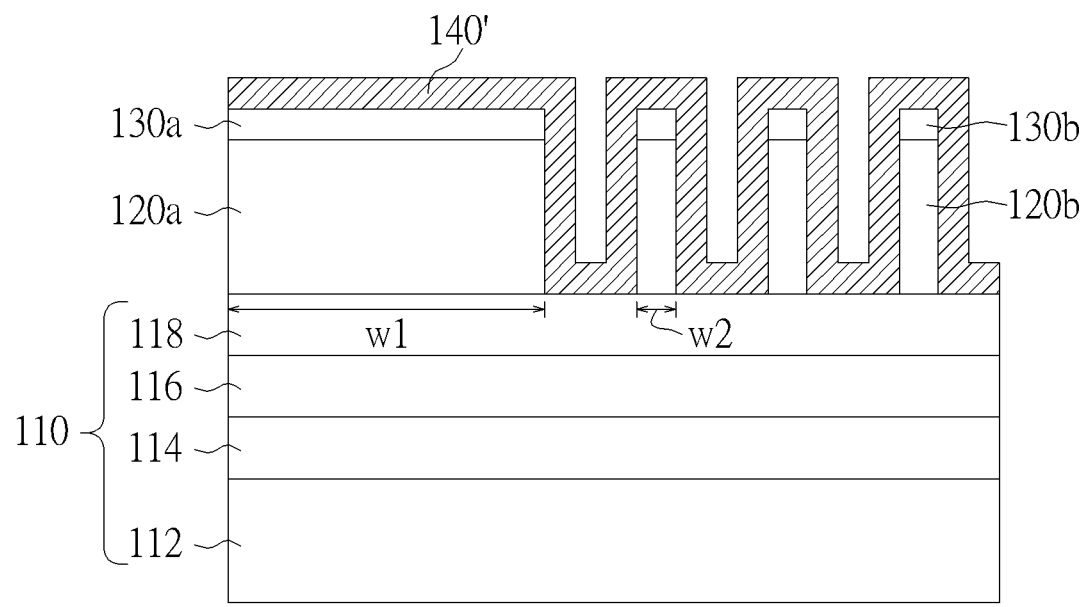
FIG. 3 schematically depicts a cross-sectional view of a method of forming a capacitor mask according to an embodiment of the present invention.
Figure 4:
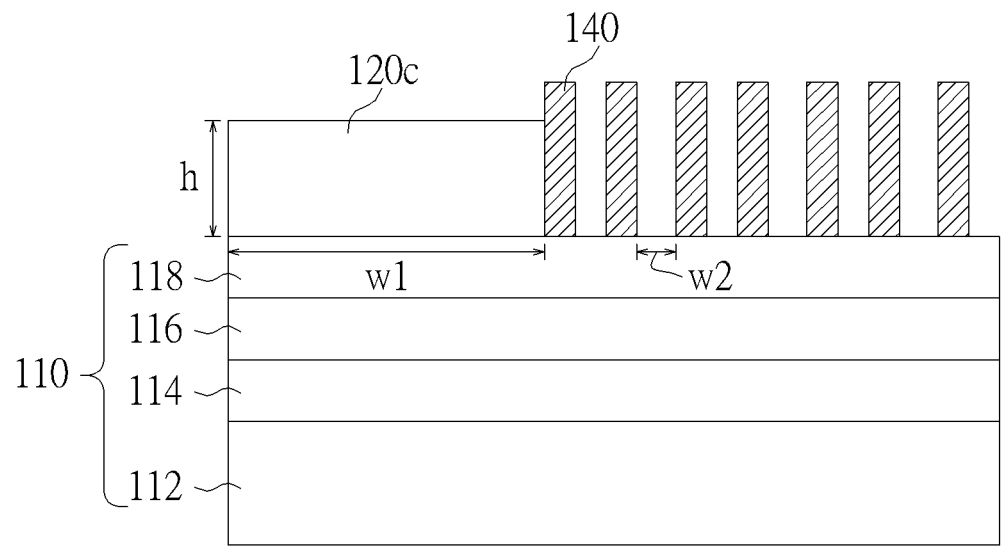
FIG. 4 schematically depicts a cross-sectional view of a method of forming a capacitor mask according to an embodiment of the present invention.
Figure 9:
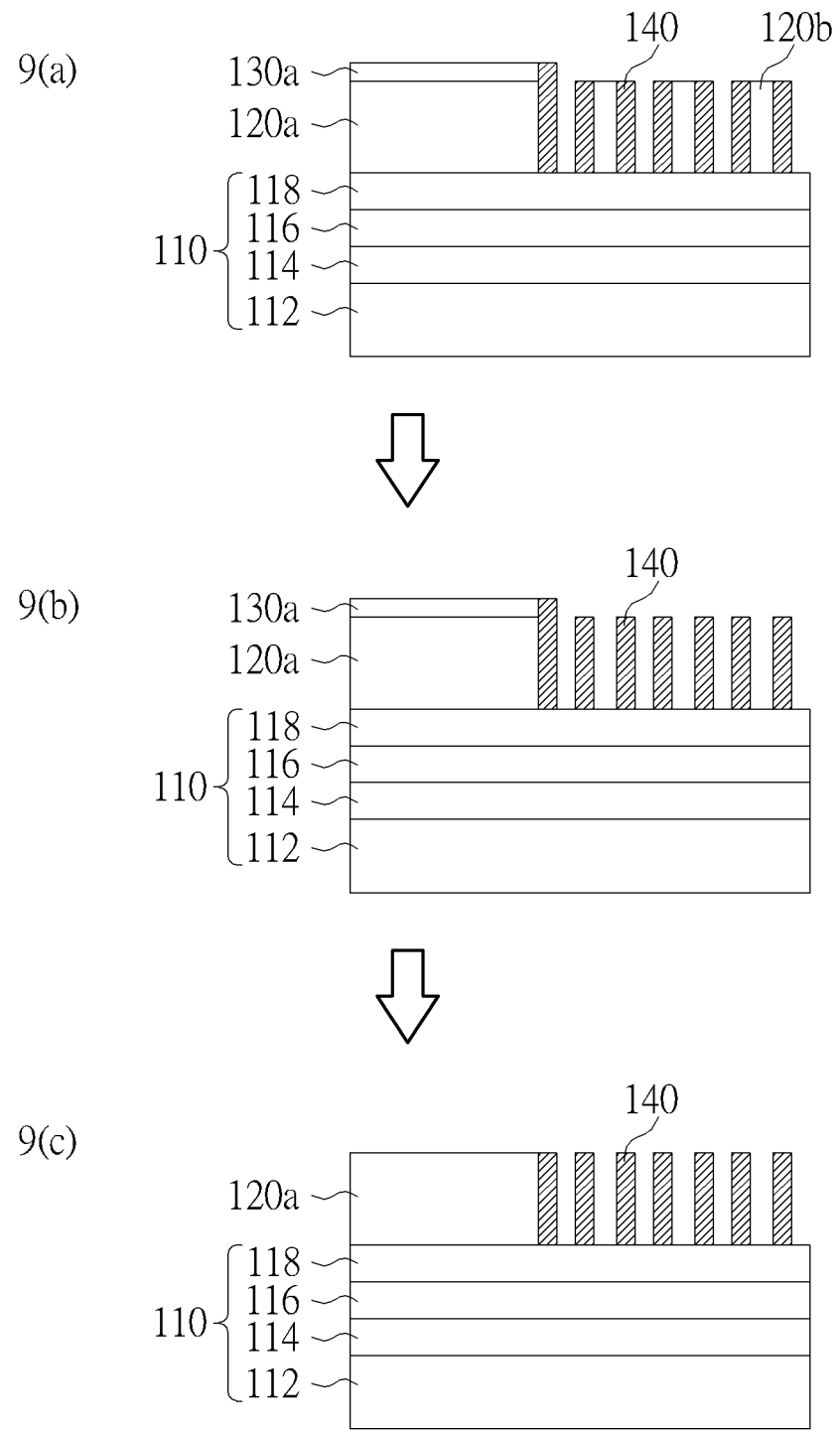
FIG. 9 schematically depicts a cross-sectional view of a method of forming a capacitor mask according to an embodiment of the present invention.

As shown in FIGS. 3-4, spacers 140 are formed on sidewalls of the bulk mandrel 120*a* and the strip mandrels 120*b*, and then the strip mandrels 120*b* are removed while a bulk mandrel 120*c* is preserved. Please refer to FIGS. 3-4 and FIG. 9. As shown in FIG. 3, a spacer material 140' is deposited to conformally cover the bulk mandrel 120*a*, the strip mandrels 120*b* and the mask layer 110. The spacer material 140' may be a nitride layer, but it is not limited thereto. The spacer material 140' is then patterned to form spacers 140, as shown in FIG. 9(*a*). In this case, the caps 130*b* on the strip mandrels 120*b* are removed but the cap 130*a* on the bulk mandrel 120*a* is preserved after the spacer material 140' is patterned to form the spacers 140. The spacer material 140' may be patterned and the caps 130*b* on the strip mandrels 120*b* may be removed by different processes. Since only the cap 130*a* on the bulk mandrel 120*a* is removed, only the strip mandrels 120*b* are removed while the bulk mandrel 120*a* is preserved, as shown in FIG. 9(*b*). The cap 130*a* on the bulk mandrel 120*a* may be removed, as shown in FIG. 9(*c*). Then, the bulk mandrel 120*a* is etched back to form the bulk mandrel 120*c*, wherein the bulk mandrel 120*c* has a height h, as shown in FIG. 4. The height h of the bulk mandrel 120*c* is adjusted by the etching back process, to make a later formed material (not shown) covering the bulk mandrel 120*c* and the spacers 140 have a flat top surface and to control the thickness of the material (not shown), wherein the material (not shown) preferably has a thin thickness to enhance process control. In this case, the bulk mandrel 120*c* directly contacts one of the spacers 140, but it is not limited thereto.

In another embodiment, the spacer material 140' of FIG. 3 may be patterned and the cap 130*a* and the caps 130*b* may be removed to form the spacers 140 of FIG. 4 and expose the bulk mandrel 120*a* and the strip mandrels 120*b*. Thereafter, due to the etching loading effect caused by a width W1 of the bulk mandrel 120*a* being larger than widths W2 of the strip mandrels 120*b*, the strip mandrels 120*b* can be removed completely by etching while the bulk mandrel 120*c* is formed at the same time.

Figure 5:
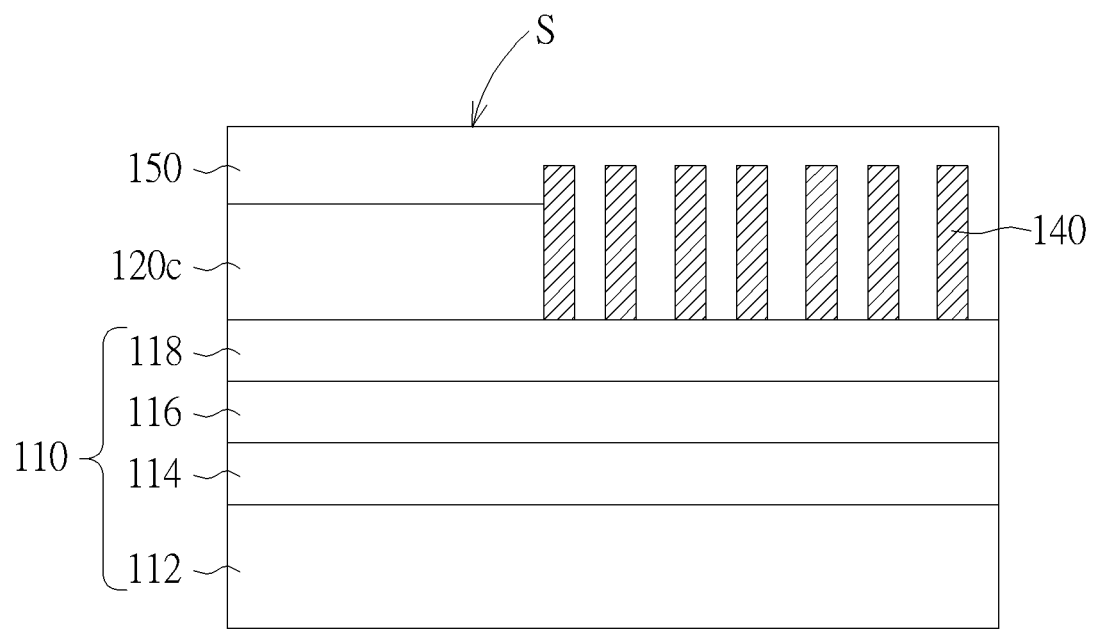
FIG. 5 schematically depicts a cross-sectional view of a method of forming a capacitor mask according to an embodiment of the present invention.
Figure 6:
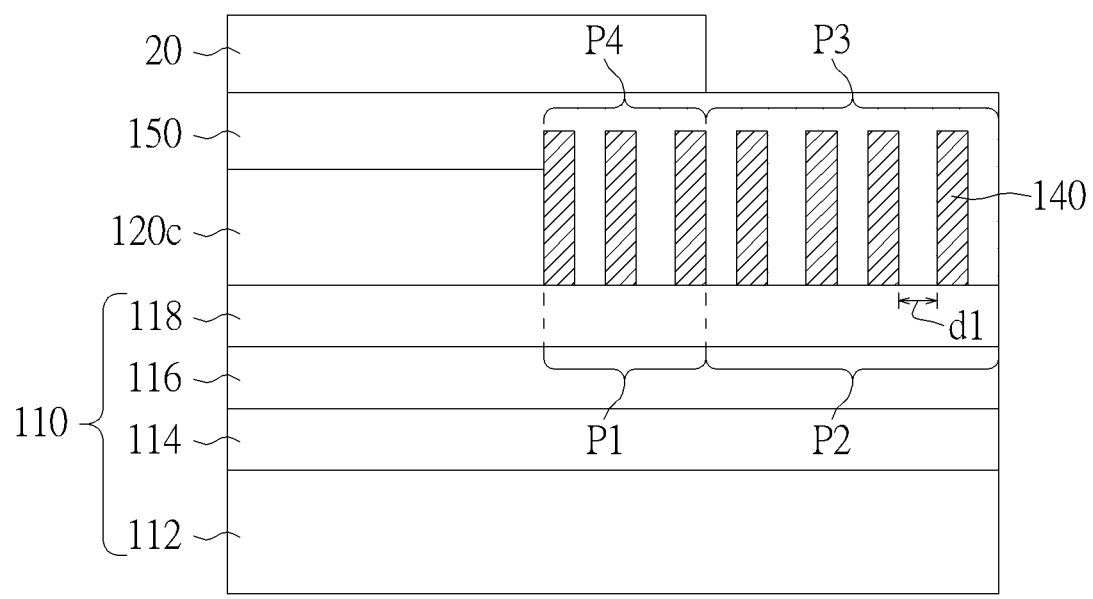
FIG. 6 schematically depicts a cross-sectional view of a method of forming a capacitor mask according to an embodiment of the present invention.

As shown in FIG. 5, a material 150 fills into space between the spacers 140 and on the bulk mandrel 120*c*, wherein the material 150 has a flat top surface S. The material 150 may be a dielectric material such as a bottom anti-reflective-coating (BARC) layer or an organic dielectric layer by a spin-on-dielectric (SOD) process, a spin-on-glass (SOG) coating process or a flowable chemical vapor deposition (FCVD) process, but it is not restricted thereto. As shown in FIG. 6, a patterned photoresist 20 is formed after filling the material 150, to cover the bulk mandrel 120*c* and a part P1 of the spacers 140 but expose the other part P2 of the spacers 140. Due to the material 150 filling up gaps d1 of the spacers 140, the residues of the patterned photoresist 20 in the gaps d1 of the spacers 140 can be avoided, after the patterned photoresist 20 is removed.

Figure 7:
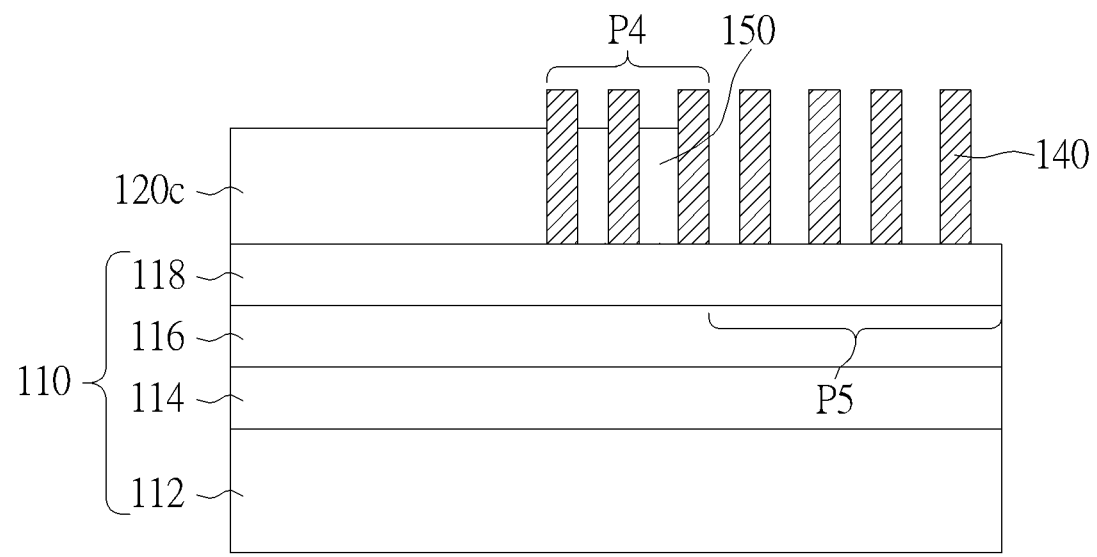
FIG. 7 schematically depicts a cross-sectional view of a method of forming a capacitor mask according to an embodiment of the present invention.

A part P3 of the material 150 exposed by the patterned photoresist 20 is then removed but the other part P4 of the material 150 covered by the patterned photoresist 20 is preserved, thereby a part P5 of the mask layer 110 being exposed, as shown in FIG. 7. The patterned photoresist 20 is then removed.

Figure 8:
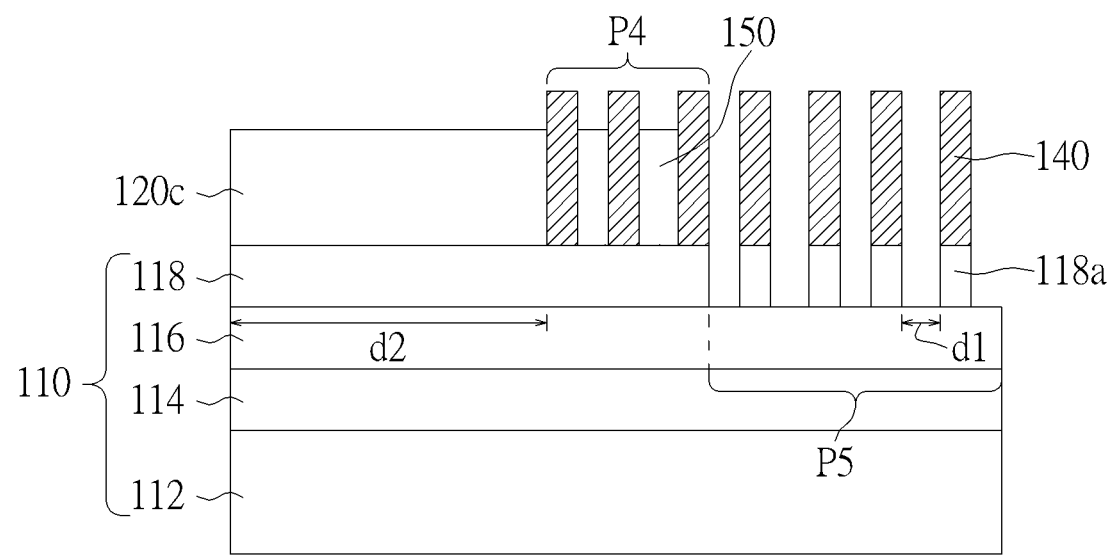
FIG. 8 schematically depicts a cross-sectional view of a method of forming a capacitor mask according to an embodiment of the present invention.

The part P5 of the mask layer 110 being exposed is patterned, (meaning the mask layer 110 exposed by the gaps d1 between the spacers 140 being removed) as shown in FIG. 8. Therefore, a part of a capacitor mask, which is formed by patterning the mask layer 110, being formed. In this embodiment, only a top layer (meaning the dielectric anti-reflection coating (DARC) layer 118) of the mask layer 110 is patterned, thereby a dielectric anti-reflection coating (DARC) layer 118*a* being formed. Then, the pattern of the dielectric anti-reflection coating (DARC) layer 118*a* is transferred to below material layers, but the present invention is not restricted thereto. By disposing the bulk mandrel 120*c* on the mask layer 110 of a non-spacer area d2, the damage or removing of the mask layer 110 of the non-spacer area d2 can be avoided while the part P5 of the mask layer 110 being exposed is patterned. There is no extra process being performed to from the bulk mandrel 120*c*, and the purpose of the present invention is achieved.

To summarize, the present invention provides a method of forming a capacitor mask, which forms a bulk mandrel and a plurality of strip mandrels on a mask layer, forms spacers on sidewalls of the bulk mandrel and the strip mandrels, removes the strip mandrels while reserving the bulk mandrel. In this way, the damage of the mask layer below the bulk mandrel can be avoided without extra process being performed while the exposed mask layer is etched to form the capacitor mask.

Moreover, after the strip mandrels are removed while the bulk mandrel is reserved, a material fills in space between the spacers and on the bulk mandrel. Then, a patterned photoresist is formed to cover a part of the material, thereby avoiding the residues of the patterned photoresist between the spacers.

In one case, the bulk mandrel may be etched back before filling the material, hence the material covering the bulk mandrel and the spacers has a flat top surface and the thickness of the material is controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
    forming a bulk mandrel and a plurality of strip mandrels on a mask layer;
    forming spacers on sidewalls of the bulk mandrel and the strip mandrels, wherein top surfaces of the spacers are higher than a top surface of the bulk mandrel at end of step of forming the spacers;
    removing the strip mandrels while reserving the bulk mandrel;
    filling a dielectric material between the spacers and on the bulk mandrel; and
    forming a patterned photoresist covering the bulk mandrel and a part of the spacers that is disposed directly next to the bulk mandrel but exposing the other part of the spacers after filling the dielectric material.

2. The patterning method according to claim 1, wherein the bulk mandrel and the strip mandrels comprise a patterned organic dielectric layer (ODL).

3. The patterning method according to claim 1, further comprising:

forming a plurality of caps on the bulk mandrel and the strip mandrels.

4. The patterning method according to claim 3, wherein the caps comprise dielectric anti-reflection coating (DARC) caps.

5. The patterning method according to claim 3, wherein the method of forming the spacers on the sidewalls of the bulk mandrel and the strip mandrels comprises:

depositing a spacer material conformally covering the bulk mandrel, the strip mandrels and the mask layer; and patterning the spacer material to form the spacers.

6. The patterning method according to claim 5, wherein the caps on the strip mandrels are removed and the cap on the bulk mandrel is reserved after the spacer material is patterned to form the spacers.

7. The patterning method according to claim 6, further comprising:

removing the cap on the bulk mandrel after the strip mandrels are removed.

8. The patterning method according to claim 7, further comprising:

etching back the bulk mandrel after the cap on the bulk mandrel is removed.

9. The patterning method according to claim 1, further comprising:

removing a part of the dielectric material exposed by the patterned photoresist after the patterned photoresist is formed, thereby a part of the mask layer being exposed; and removing the patterned photoresist.

10. The patterning method according to claim 9, further comprising:

removing the part of the mask layer being exposed after the part of the dielectric material exposed by the patterned photoresist is removed.

11. The patterning method according to claim 1, wherein the mask layer comprises a polysilicon layer, a silicon nitride layer, an organic dielectric layer (ODL), a dielectric anti-reflection coating (DARC) layer stacked from bottom to top.

12. The patterning method according to claim 1, wherein the bulk mandrel directly contacts one of the spacers.

13. The patterning method according to claim 1, wherein the dielectric material has a flat top surface.

14. The patterning method according to claim 1, further comprising:

forming a plurality of caps on the bulk mandrel and the strip mandrels after the bulk mandrel and the strip mandrels are formed on the mask layer;

removing the caps on the bulk mandrel after the strip mandrels are removed; and filling the dielectric material between the spacers and on the bulk mandrel after the caps being removed.

15. The patterning method according to claim 1, wherein all of the spacers disposed within a part of the mask layer being exposed are fully exposed, and the other part of the spacers are partially exposed from the dielectric material.

* * * * *